(12) United States Patent
Liu et al.

(10) Patent No.: US 7,135,395 B2
(45) Date of Patent: *Nov. 14, 2006

(54) BONDING PAD STRUCTURE TO MINIMIZE IMD CRACKING

(75) Inventors: Chung Liu, Taipei (TW); Yuan-Lung Liu, Yuan-Lin (TW); Ruey-Yun Shiue, Hsin Chu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 107 days.

This patent is subject to a terminal disclaimer.

(21) Appl. No.: 10/916,797

(22) Filed: Aug. 12, 2004

(65) Prior Publication Data

US 2005/0064693 A1    Mar. 24, 2005

Related U.S. Application Data

(63) Continuation of application No. 09/945,432, filed on Sep. 4, 2001.

(51) Int. Cl.
*H01L 21/44* (2006.01)

(52) U.S. Cl. .................................................... 438/612

(58) Field of Classification Search ................ 438/597, 438/598, 599, 612
See application file for complete search history.

(56) References Cited

U.S. PATENT DOCUMENTS

| | | | |
|---|---|---|---|
| 5,731,243 A | 3/1998 | Peng et al. | 438/612 |
| 6,002,179 A | 12/1999 | Chan et al. | 257/781 |
| 6,025,277 A | 2/2000 | Chen et al. | 438/738 |
| 6,232,662 B1 | 5/2001 | Saran | 257/750 |
| 6,236,114 B1 | 5/2001 | Huang et al. | 257/758 |
| 6,313,540 B1 | 11/2001 | Kida et al. | 257/784 |
| 6,465,895 B1 | 10/2002 | Park et al. | 257/782 |

*Primary Examiner*—Scott B. Geyer

(57) ABSTRACT

A method is disclosed of forming a bonding pad that is immune to IMD cracking. A partially processes semiconductor wafer is provided having all metal levels completed. A blanket dielectric layer is formed over the uppermost metal level. Patterning and etching said dielectric layer horizontal and vertical arrays of trenches are formed passing through the dielectric layer and separating the dielectric layer into cells. The trenches are filled with a conducting material and, after performing CMP, bonding metal patterns are deposited. Wires are bonded onto said bonding metal patters, after which a passivation layer is formed.

15 Claims, 4 Drawing Sheets

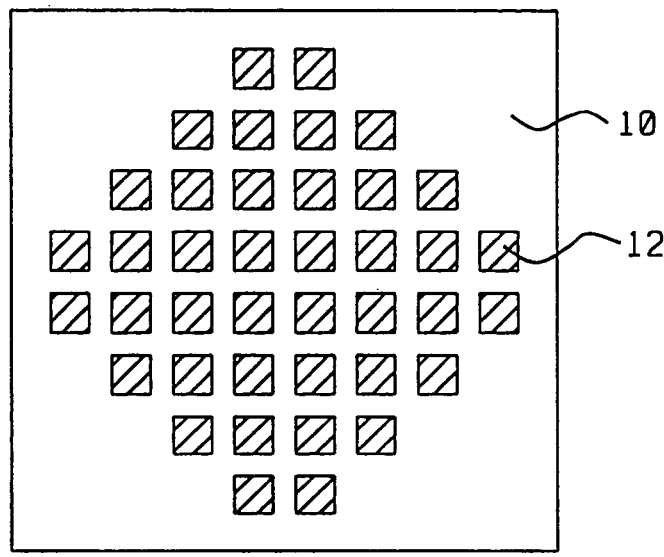
FIG. 1a – Prior Art
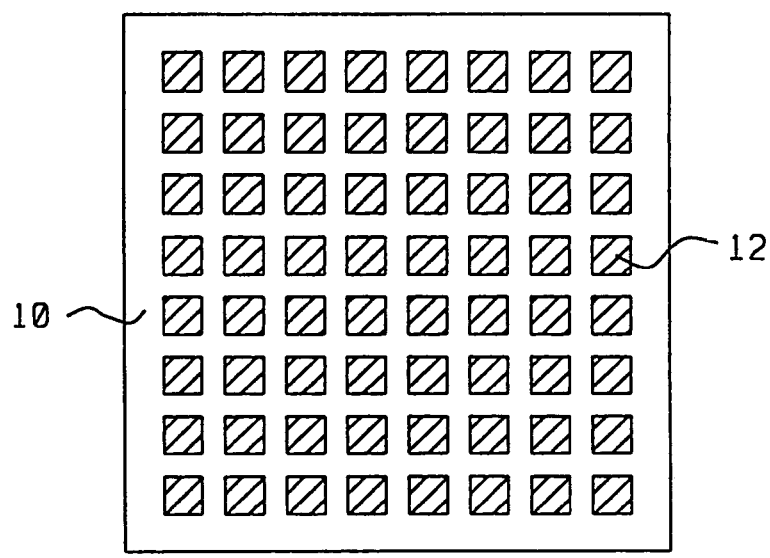
FIG. 1b – Prior Art

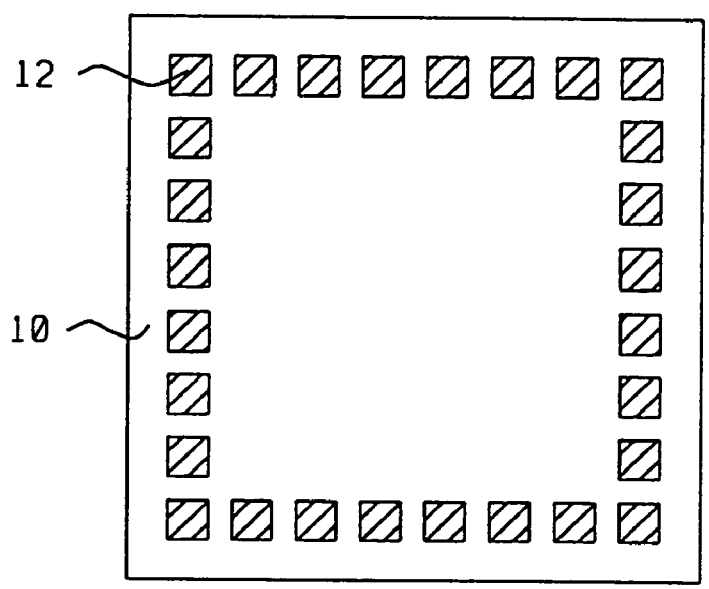
FIG. 1c – Prior Art
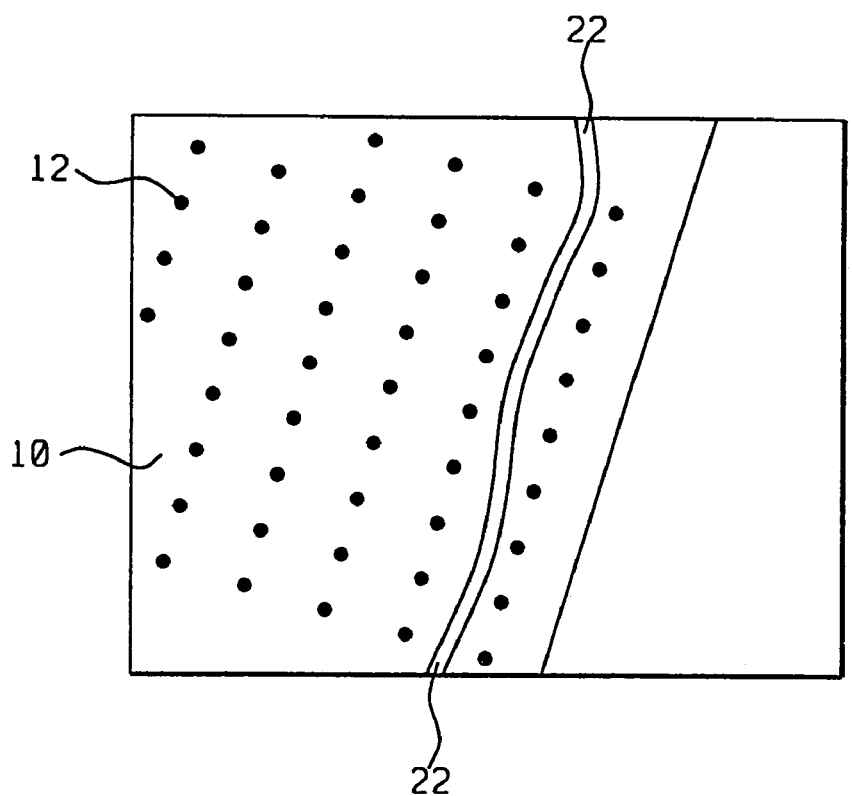
FIG. 2

BONDING PAD STRUCTURE TO MINIMIZE IMD CRACKING

CROSS-REFERENCE TO RELATED APPLICATIONS

This application is a continuation of currently pending U.S. non-provisional patent application Ser. No. 09/945,432, filed Sep. 4, 2001 now U.S. Pat. No.6,875,682, by Liu et al., titled "Novel Mesh Pad Structure to Eliminate IMD Crack on Pad," the entire contents of which application is incorporated by reference herein.

BACKGROUND OF THE INVENTION (1) Field of the Invention

The present invention relates generally to semiconductor integrated circuit processing and more particularly to contact pad structures that resist intermetal dielectric cracking.

(2) Description of Prior Art

Bonding pads are the interfaces between the integrated circuits contained in semiconductor chips and the chip package. A large number of bonding pads is required to transmit power, ground and impute/output signals to the chip devices. It is thus important that the bonding pad yield be sufficiently high to ensure a high per chip yield.

The general bonding pad structure consists of metal layers, emanating from the terminals of the chip devices, separated by intermetal dielectric (IMD) layers that are often silicon oxide. Metal vias, W is often used, pass through the IMD layers connecting the metal layers. Wires are bonded to a bonding metal pattern and to the chip package forming electrical connections between the chip and the package. A passivation layer covers the surface, except over the bonding sites, to seal the chip from contaminants and for scratch protection.

One mode of failure of the bonding pad relates to the peeling of the wire from the metal pattern due to forces exerted especially during the bonding process. This has been addressed in U.S. Pat. No. 6,002,179 to Chan et al., who teach a bonding pad structure with increased peeling resistance and in U.S. Pat. No. 5,731,243 to Peng et al., who show a cleaning method to ensure contamination free bonding. Another failure mode that has been observed relates to bonding pad peel back, where forces during wire bonding may cause a delaminating of one or more of the underlying layers. Bonding pad structures that resist bond pad peeling have been disclosed in U.S. Pat. No. 6,025,277 to Chen et al. and in U.S. Pat. No. 5,707,894 to Hsiao.

Another failure mode involves cracking of the IMD. Referring to FIGS. 1a, 1b, and 1c, there is shown conventional via hole arrays. Regions 10 are IMD oxide layers, and regions 12 are metal filled via holes passing through the IMD. Cracks that are observed in the IMD are similar to that depicted in FIG. 2. These are cracks that propagate along the IMD layer avoiding the metal of the vias. Once a small crack is initiated it will, under stresses prevalent in the layer during processing, grow extensively. Approaches to alleviate this cracking of the IMD focus on producing IMD layers with low residual stress. Composite silicon oxide layers serve this purpose and are used, such as HDP plus PETEOS layers. However, even with composite silicon oxide layers to reduce stress, the IMD layer is not strong enough to withstand stresses encountered during chip packaging and IMD cracking is still observed.

SUMMARY OF THE INVENTION

It is a primary objective of the invention to provide a bonding pad structure that is immune to IMD cracking, withstanding even the stresses encountered during chip packaging. A novel mesh pad structure is proposed that will increase the bonding pad strength and eliminate extensive cracking of the IMD. Instead of traditional via holes, via trenches are formed through the IMD, dividing the remaining IMD into small cells. After the trenches are filled with metal the metal trenches enclose the cells. This increases the strength of the bonding pad so that IMD cracking is less likely to occur. Furthermore, even in the unlikely event of the initiation of an IMD crack, the crack will propagate no further than the metal trench.

A method is disclosed of forming a bonding pad that is immune to IMD cracking. A partially processed semiconductor wafer is provided having one to all but one metal levels completed. A blanket dielectric layer is formed over the metal level. Patterning and etching said dielectric layer horizontal and vertical arrays of trenches are formed passing through the dielectric layer and separating the dielectric layer into cells. The trenches are filled with a conducting material and, after performing CMP, bonding metal patterns are deposited. Wires are bonded onto said bonding metal patterns, after which a passivation layer is formed.

BRIEF DESCRIPTION OF THE DRAWINGS

In the accompanying drawing forming a material part of this description, there is shown:

FIGS. 1a, 1b and 1c, Prior Art, show conventional via patterns.

FIG. 2 depicts a crack in the IMD of a conventional bonding pad.

DESCRIPTION OF THE PREFERRED EMBODIMENTS

Figure 3:
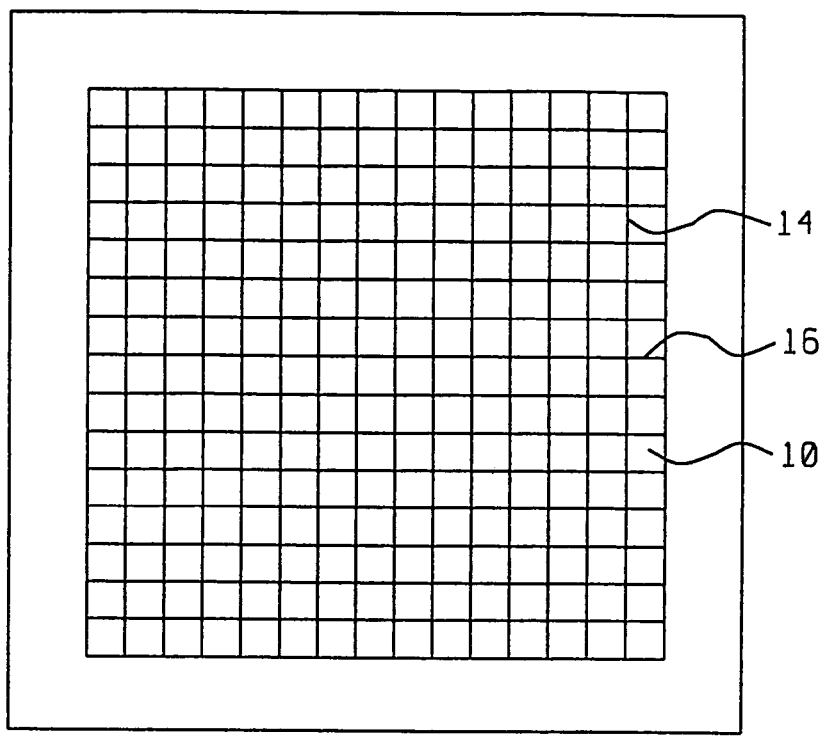
FIG. 3 shows the basic pattern of the mesh via trenches.

FIG. 3 illustrates the basic pattern of the novel mesh pad structure. The IMD, 10, is separated into cells by perpendicular arrays of metal filled via trenches. The array 14 is denoted the vertical array and the array 16 the horizontal array. The strength of the IMD-via trench structure is higher than that of the traditional IMD-via hole structures, such as those depicted in FIGS. 1a, 1b and 1c. Thus, initiation of cracks in the IMD will occur less frequently for the mesh pad structure than for traditional structures utilizing via holes, such as those depicted in FIGS. 1a, 1b and 1c. Furthermore, even in the remote possibility of initiation of a crack in the IMD of a mesh pad structure, the crack could only propagate as far as the metal filled trench which border the IMD cells. Thus the crack size is limited to be less than about the cell diagonal. In the case of traditional via hole pad structures, such as those depicted in FIGS. 1a, 1b and 1c, the crack can propagate over large distances avoiding metal filled via holes. The reduced damage in the case of a mesh pad structure is manifested in substantial improvement of the quality and reliability of the bonding pad.

Basic elements of a bonding pad structure consist of metal layers, emanating from the terminals of the chip devices, separated by IMD layers. Also there is an IMD layer separating the uppermost metal layer from a bonding metal pattern that is formed over this IMD layer and there are metal connectors passing through the IMD layers connecting the metal layers to the bonding metal pattern. Wires are bonded to the bonding metal pattern and to the chip package forming electrical connections between the chip and the package. A passivation layer covers the surface, except over the bonding sites, to seal the chip from contaminants and for scratch protection.

A mesh via trench pattern can be used between any two levels of metal. However, its crack resistance properties are mostly utilized when used between the uppermost metal layer and the bonding metal pattern. To form the via trench pattern, a blanket dielectric, layer is first formed over the uppermost metal layer, using techniques well known to those skilled in the art. This dielectric layer is often silicon oxide. Composite layers are useful in relieving internal stress in the dielectric, stress that contributes to cracking in the dielectric layer, and preferred embodiments of the invention utilize such layers. Composite dielectric layers that are used to relieve internal stress include dual oxide layers, where, for instance, one of the layers is formed using HDP and the other using PETEOS, for example, 7000 Angstroms can be deposited using HDP and 17000 Angstroms using PETEOS.

Figure 4:
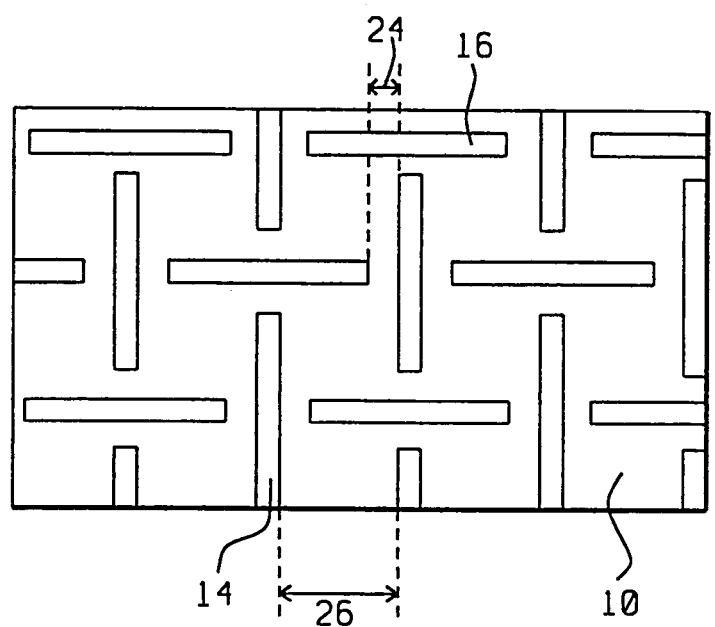
FIG. 4 shows a mesh via trench structure without trench intersection.
Figure 5:
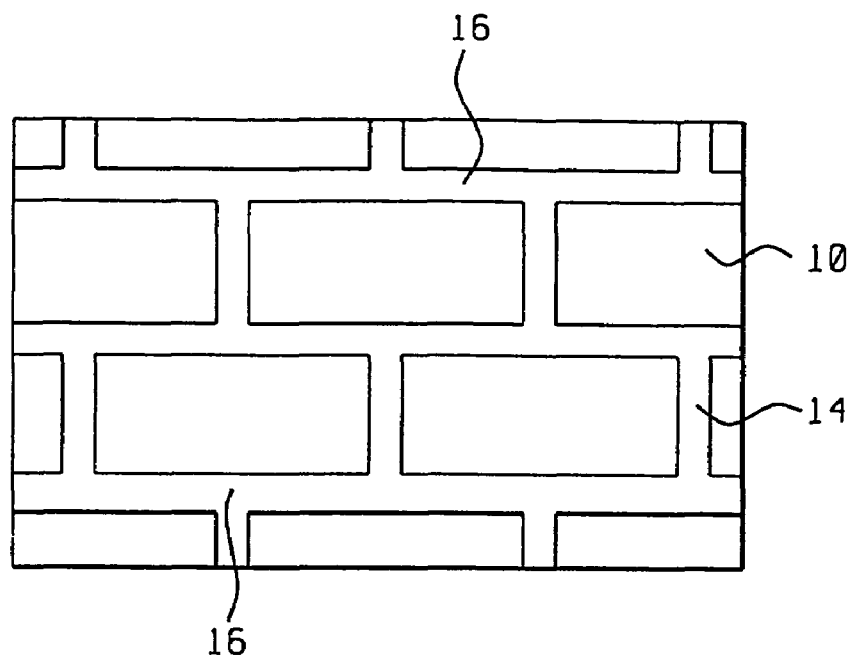
FIG. 5 shows a mesh via trench structure with a brick-laying pattern.
Figure 6:
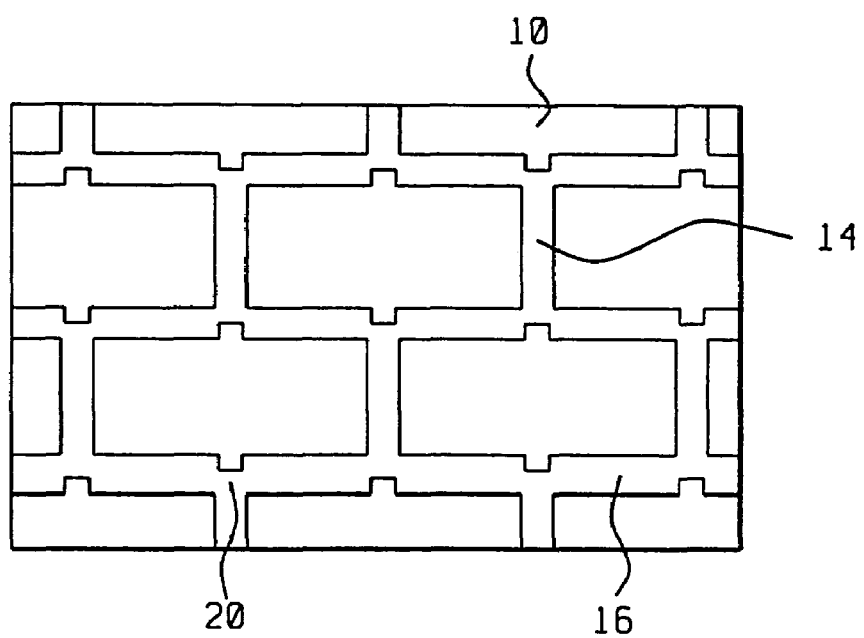
FIG. 6 shows a mesh via trench structure with a modified brick-laying pattern.

However, composite dielectric layers do not protect the IMD layers from cracking as a result of stresses arising during chip packaging. This protection is achieved by the novel mesh pad structures of the embodiments of the invention. In contrast to the traditional bonding pad, in which via holes through the IMD layer are used to provide electrical connection between the metal layers, in a mesh pad structure electrical connection is achieved by via trenches. Via trenches are formed using the same well known processes as via holes, except that the shapes of the openings are rectangular-like. Via trench layouts are designed to separate the IMD into small cells, which, when the trenches are filled with metal, are essentially surrounded by metal filled trenches. For trench widths of between about 0.1 and 0.5 micrometers and for trench lengths between about 0.1 and 100 micrometers, which also provides the cell dimension, the IMD strength is significantly increased, and crack sizes are limited to less than about the cell diagonal. A via trench layout according to preferred embodiments of the invention in which trenches do not intersect is shown in FIG. 4. This form of layout will be referred to as the nonintersecting layout. Arrays of horizontal, 16, and vertical, 14, trenches nearly divide the IMD layer, 10, into cells though they do not intersect. Trench widths are between about 0.1 and 0.5 micrometers and the trench lengths are between about 0.1 and 100 micrometers for trenches in both the vertical and horizontal arrays. In this layout there is a separation between a trench and its perpendicular neighbors. An advantage of nonintersecting via trenches is that there is a tendency toward void formation when filling an intersection with metal and nonintersecting via trenches avoids this void formation. In this layout the trenches do not fully surround the IMD. However, if the ratio between the spacing of perpendicular trenches, 24, to the spacing of parallel trenches, 26, is kept small, less then about ⅕, cracks will not propagate much beyond a cell before being stopped by a trench. A spacing of perpendicular trenches greater then about 0.1 micrometers is required, however, to avoid overlap. Another trench layout according to preferred embodiments of the invention is referred to as the bricklaying layout and is depicted in FIG. 5. Here the trenches, 14 and 16, do actually divide the IMD layer, 10, into closed cells. However, even though the vertical and horizontal trench arrays do not completely cross each other, there is, T-shaped overlap at positions, 18. Void formation still occurs during metal filling of the trenches at overlaps such at positions 18, however this is at a reduced frequency as compared with crossing intersections. Trench widths are between about 0.1 and 0.5 micrometers and the trench separation is between about 0.1 and 10 micrometers for horizontal trenches and between about 0.1 and 10 micrometers for vertical trenches. To further reduce the tendency for void formation at the overlaps, a trench layout, denoted as the modified bricklaying layout and shown in FIG. 6, is utilized in other preferred embodiments of the invention. Except for overlap region, 20, the trench layout and dimensions for the modified bricklaying layout are similar to the trench layout and dimension for the bricklayer layout. The overlap region, 20, for the modified bricklaying layout is reduced from that of the overlap region, 18, for the bricklaying layout and results in a reduction in voiding. Modified bricklaying overlaps between 0.1 and 1 micrometer of the bricklaying overlap achieve significant reductions in voiding, yet provide complete enclosure of the IMD in the cells.

Filling of the via trenches with conductive material is accomplished, in preferred embodiments of the invention, using W plug processes, which are well known to those versed in the art. Other embodiments of the invention utilize alternative plug processes, such as Al plug, Cu plug, or silicide plug processes. Following the metal filling of the trenches, chemical/mechanical polishing (CMP), a process well known to practitioners of the art, is used to planarize the surface. Bonding metal patterns are then deposited, according to procedures well known to those versed in the art. Wires are bonded to bonding metal patterns and a passivation layer is formed, using processes, for both, that well known to those versed in the art.

While the invention has been particularly shown and described with reference to the preferred embodiments thereof, it will be understood by those skilled in the art that various changes in form and detail may be made without departing from the spirit and scope of the invention.

The invention claimed is:

1. A method of forming a bonding pad, comprising:
   providing a partially processed semiconductor wafer having all metal levels completed;
   forming a blanket dielectric layer over an uppermost metal level;
   patterning and etching said dielectric layer to form horizontal and vertical arrays of trenches passing through said dielectric layer;
   filling said trenches with a conducting material;
   planarizing said conducting material to obtain a top surface;
   forming bonding metal patterns over said top surface; and
   forming a passivation layer over said top surface and said bonding metal patterns;
   wherein said vertical array of trenches comprises a first plurality of trenches each having a first length and a first width, the first being greater than the first width; said horizontal arrays of trenches comprises a second plurality of trenches each having a second length and a second width, the second length being greater than the second width; and wherein none of said first plurality of trenches intersects with any of said second plurality of trenches.

2. The method of claim 1, wherein the separation between neighboring horizontal trenches and neighboring vertical trenches is between 0.1 and 10 micrometers.

3. The method of claim 2, wherein the ratio between the spacing of perpendicular trenches to the spacing of parallel trenches is less than about 1/5.

4. The method of claim 3, wherein the spacing of perpendicular trenches is greater than about 0.1 micrometers.

5. The method of claim 1, wherein the lengths of each of the plurality of trenches of said vertical array of trenches are oriented substantially perpendicular to the lengths of each of the plurality of trenches of said horizontal array of trenches.

6. A method of forming a bonding pad, comprising:
providing a partially processed semiconductor wafer having all metal levels completed;
forming a blanket dielectric layer over the uppermost metal level;
patterning and etching said dielectric layer to form horizontal and vertical arrays of trenches passing through said dielectric layer according to a brick laying layout or a modified brick laying layout;
filling said trenches with a conducting material;
planarizing said to obtain a top surface;
forming bonding metal patterns over said top surface;
bonding wires onto said bonding metal patterns; and
forming a passivation layer over said top surface and said bonding layer patterns.

7. The method of claim 6 wherein said dielectric layer is composed of materials from the group: silicon oxide, silicon nitride, silicon oxynitride.

8. The method of claim 6 wherein said dielectric layer is a composite of dielectric layers.

9. The method of claim 6 wherein the filling of said trenches with a conducting material is accomplished using a plug process.

10. The method of claim 6 wherein the filling of said trenches with a conducting material is accomplished using a W plug process.

11. The method of claim 6 wherein the filling of said trenches with a conducting material is accomplished using a plug process from the group: Al plug, Cu plug and silicide plug.

12. The method of claim 6 wherein the width of said trenches is between 0.1 and 0.5 micrometers.

13. The method of claim 6 wherein the separation between neighboring horizontal trenches is between 0.1 and 10 micrometers and neighboring vertical trenches is between 0.1 and 10 micrometers.

14. The method of claim 6 wherein the overlap area in said modified bricklaying layout is between 0.1 and 1 micrometer of the overlap area of said bricklaying layout.

15. A method comprising:
providing a semiconductor wafer having an upper metal layer;
forming a blanket dielectric layer over the upper metal level;
forming a conductive pattern in the blanket dielectric layer, said conductive pattern comprising horizontal and vertical arrays of trenches passing through said dielectric layer and having a bricklaying layout, said trenches being at least partially filled with a conducting material; and
forming a bonding metal pattern on said conductive pattern.

* * * * *

UNITED STATES PATENT AND TRADEMARK OFFICE
CERTIFICATE OF CORRECTION

PATENT NO. : 7,135,395 B2  
APPLICATION NO. : 10/916797  
DATED : November 14, 2006  
INVENTOR(S) : Chung Liu, Yuan-Lung Liu and Ruey-Yun Shiue Page 1 of 1

It is certified that error appears in the above-identified patent and that said Letters Patent is hereby corrected as shown below:

Column 4, line 61, after "first" insert -- length --.

Column 5, line 23, after "said" insert -- conducting material --.

Signed and Sealed this

Twenty-fourth Day of July, 2007

JON W. DUDAS  
*Director of the United States Patent and Trademark Office*